(12) United States Patent
Patapoutian (10) Patent No.: US 7,559,008 B1
(45) Date of Patent: Jul. 7, 2009

(54) NESTED LDPC ENCODERS AND DECODER

(75) Inventor: Ara Patapoutian, Hopkinton, MA (US)

(73) Assignee: Maxtor Corporation, Longmont, CO (US)

( * ) Notice: Subject to any disclaimer, the term of this patent is extended or adjusted under 35 U.S.C. 154(b) by 641 days.

(21) Appl. No.: 11/430,803

(22) Filed: May 9, 2006

Related U.S. Application Data

(60) Provisional application No. 60/723,039, filed on Oct. 3, 2005.

(51) Int. Cl.
*G06F 11/00* (2006.01)

(52) U.S. Cl. .................................... 714/800

(58) Field of Classification Search .......... 714/799–801
See application file for complete search history.

(56) References Cited

U.S. PATENT DOCUMENTS

| | | | |
|---|---|---|---|
| 6,275,965 | B1 | 8/2001 | Cox et al. |
| 7,139,959 | B2 * | 11/2006 | Hocevar ..................... 714/752 |
| 7,197,690 | B2 * | 3/2007 | Shen et al. ................... 714/792 |
| 7,254,769 | B2 * | 8/2007 | Kim et al. .................... 714/774 |
| 7,313,752 | B2 * | 12/2007 | Kyung et al. ................. 714/801 |

\* cited by examiner

*Primary Examiner*—Shelly A Chase
(74) *Attorney, Agent, or Firm*—Cesari and McKenna, LLP; Patricia A. Sheehan (57) ABSTRACT

An LDPC encoding system produces an encoded block by encoding the data as i data sub-blocks using an LDPC code $H_1$, XOR'ing the $H_1$ sub-block code words to generate a block code word and further encoding the block code word using an LDPC code $H_2$ to produce p parity bits. The encoded block consists of a concatenation of the $H_1$ code words and the p parity bits. To decode the encoded block, the system decodes each $H_1$ sub-block code word and, if all of the $H_1$ sub-block code words converge, the block has been successfully decoded. Otherwise, if one of the $H_1$ code words fails to converge, the system performs an "extended" decoding operation in which the system produces a vector C by XOR'ing the i−1 properly decoded $H_1$ sub-block code words. The system then combines the vector C with the sign values of the failed $H_1$ sub-block code word, appends the parity bits and decodes the result as an $H_2$ code word over the $H_2$ LDPC code. For a next iteration, the system removes the vector C from the non-parity sign bits of the decoded $H_2$ code word and provides the results along with the associated reliability information to an ISI detector for further decoding to produce an updated failed $H_1$ code word. The updated $H_1$ sub-block code word is then iteratively decoded as part of an $H_2$ code word, and so forth, by combing and removing the vector C.

11 Claims, 7 Drawing Sheets

$$M = \begin{bmatrix} 1 & 0 & 0 & \cdots & 0 & 0 & 0 \\ 0 & 0 & 0 & \cdots & 0 & 0 & 0 \\ 0 & 0 & 1 & \cdots & 0 & 0 & 0 \\ 0 & 0 & 0 & \cdots & 0 & 0 & 0 \\ \hline 0 & 0 & 0 & \cdots & 0 & 0 & 0 \\ \vdots & \vdots & \vdots & & \vdots & \vdots & \vdots \\ 0 & 0 & 0 & \cdots & 1 & 0 & 0 \\ 0 & 0 & 0 & \cdots & 0 & 1 & 0 \\ 1 & 0 & 0 & \cdots & 0 & 0 & 0 \end{bmatrix}$$

$\underbrace{\hphantom{xxxxxx}}_{H_1} \underbrace{\hphantom{xxxxxx}}_{H_2}$

NESTED LDPC ENCODERS AND DECODER

CROSS-REFERENCE TO RELATED APPLICATIONS

The present application claims the benefit of U.S. Provisional Patent Application Ser. No. 60/723,039 which was filed on Oct. 3, 2005, by Ara Patapoutian for a NESTED LDPC ENCODERS AND DECODER and is hereby incorporated by reference.

BACKGROUND OF THE INVENTION

1. Field of the Invention

The invention relates generally to large block size error correction encoding and decoding systems and, more particularly, to large block size low density parity check code systems.

2. Background Information

One way to improve the performance of error correcting codes is to use larger block sizes. A known prior system described in U.S. Pat. No. 6,275,965 to Cox, et al. uses Reed-Solomon error correcting codes ("ECC's") and two levels of encoding to handle a larger block size. The Cox system segments the d data bytes into multiple-bytes segments and simultaneously encodes the segments and certain combinations thereof using two ECCs, to produce redundancy information that corresponds to both the segments and the block. The Cox system then produces an encoded block, which consists of an interleave of the data and the redundancy information.

The Cox system decodes the encoded block by simultaneously de-interleaving and manipulating the data symbols of the block in accordance with the two ECC's, to generate associated redundancy information, that is, the system generates both segment and block redundancy information. The Cox system then uses the generated segment and block redundancy information and the segment and block redundancy information that is included in the encoded block to generate error syndromes that correspond, respectively, to the individual segments and to the block. The system uses both the segment and the block error syndromes to detect and, if possible, correct errors in the data. The Cox system thus manipulates the entire block to generate the redundancy information that is required for error correction.

While the two-level system works well with Reed-Solomon ECC's, the ECCs of interest are low density parity check ("LDPC") codes, which are a different class of codes that generally have a better performance than the Reed Solomon ECCs. The LDPC ECCs use "soft" decision information. The soft information for a single bit of the encoded block consists of a sign, or bit, value and a plurality of bits of reliability information. The LDPC block decoding operations involve iteratively updating the sign value and the reliability information that correspond to the bits of the encoded block until either the result converges or a predetermined number of iterations are performed. Accordingly, the sign and the reliability information for the entire block must be retained in buffers for the decoding of the block, and the buffers must be many times as large, for example, 4 or 5 times as large, as the number of bits in the block. The large buffers add both complexity and cost to the system.

One solution is to encode and decode the block data both as sub-blocks of data using an LDPC code and in its entirety using a Reed Solomon ECC. The problem with this solution, however, is that the sub-block and block ECC's are of different classes, which means that different decoding hardware is required for the block decoding and for the sub-block decoding. Thus, this solution essentially trades one type of hardware complexity, i.e., large buffers, for another, and results in little, if any, savings in gate count and/or associated cost. Further, the better performance LDPC code is used only for the shorter sub-blocks, and thus, the benefits of using the LDPC code are not provided over the larger block.

Accordingly, what is needed is a system and method for LDPC decoding that takes advantage of block level LDPC encoding but does not require the buffering of the soft information for the entire block.

SUMMARY OF THE INVENTION

An LDPC encoding system produces an encoded block that includes "b" bytes of data by treating the data as i data sub-blocks $D_1, D_2 \ldots D_i$ and separately and independently encoding each sub-block using an LDPC code $H_1$, to produce associated sub-block parity bits $z_1, z_2, \ldots z_i$ that together with the data form $H_1$ sub-block code words. The LDPC encoding system next XOR's the $H_1$ sub-block code words, $D_1z_1$, $D_2z_2 \ldots D_iz_i$, to generate a block code word Dz, which is also a code word of the $H_1$ code. The encoding system then encodes the $H_1$ block code word to produce p parity bits, using an LDPC code $H_2$ and treating the $H_1$ block code word as "data." The encoded block consists of a concatenation of the $H_1$ code words $D_1z_1, D_2z_2, \ldots D_8z_8$ and the p parity bits.

To decode the encoded block, the system decodes each $H_1$ sub-block code word separately and independently, that is, on-the-fly. An ISI detector assigns a sign value and reliability information to each bit of a given $H_1$ sub-block code word, and an LDPC decoder manipulates and updates the sign value and the reliability information using the $H_1$ code. The ISI detector and the LDPC decoder then operate iteratively in a known manner to determine if the $H_1$ sub-block code word converges over the $H_1$ code. If the given $H_1$ sub-block code word converges, the system retains only the associated sign values. If the $H_1$ sub-block code word fails to converge, the system does not retain any values or information for the given code word.

The system continues to decode the remaining $H_1$ sub-blocks code words, either until another $H_1$ sub-block code word fails to converge, and the block is thus determined to be unsuccessfully decoded, or until all of the sub-block code words are successfully decoded.

If every one of the $H_1$ sub-block code words independently converges, the system determines that the block has been successfully decoded and the system ignores the p parity bits. If, however, one of the $H_1$ code words fails to independently converge, the system performs an "extended" decoding operation that involves the p parity bits.

For the extended decoding, which is an error recovery operation, the system produces a vector C by XOR'ing the properly decoded $H_1$ code words, that is, the retained bits of the i−1 $H_1$ code words that converged. The system next combines the vector C with the sign values associated with the failed $H_1$ sub-block code word, to produce a "noisy" $H_1$ block code word. The system then produces an $H_2$ code word for decoding using the LDPC $H_2$ code by treating the $H_1$ block code word as $H_2$ code word "data" and appending thereto the p parity bits. The system then provides to the LDPC decoder the $H_2$ code word along with the reliability information associated with the failed $H_1$ code word and, as appropriate, with the p parity bits. The LDPC decoder then decodes the $H_2$ code word over the $H_2$ code, to produce an updated estimate of the $H_2$ code word.

The system next removes the vector C from the non-parity sign bits of the updated $H_2$ code word, that is, from the data portion of the $H_2$ code word. The result is an updated estimate of the sign values and reliability information for the failed $H_1$ sub-block code word. The system then provides the updated failed $H_1$ sub-block code word to the ISI detector as part of a next iteration step. The ISI detector operates in a known manner to further update the sign values and reliability information for the failed $H_1$ code word. As appropriate, the system also separately provides the p parity bits and associated reliability information to the ISI detector, and the ISI detector separately updates the sign values and reliability information for the p parity bits. As a next step in the iteration, the system again combines the vector C with the sign values of the updated failed $H_1$ sub-block code word, to produce an updated $H_1$ block code word. The system again treats the block code word as the data portion of an $H_2$ code word and appends the p parity-bits, to produce an updated $H_2$ code word. The $H_2$ code word and the associated reliability information is then provided to the LDPC decoder, and the LDPC decoder decodes the $H_2$ code word over the $H_2$ code as part of the iteration.

The LDPC decoder operates in a known manner to manipulate the supplied sign and reliability information using the $H_2$ code, to produce a next updated estimate of the $H_2$ code word. The system then performs a next iteration by removing the vector C from the updated $H_2$ code word and supplying to the ISI detector the results, that is, an updated estimate of the failed $H_1$ sub-block code word and an updated estimate of the p parity bits. The iterations continue in this manner with the vector C being removed before the ISI detector decoding of the updated failed $H_1$ sub-block code word and included before the LDPC decoder decoding of the updated $H_2$ code word until there is convergence or a predetermined number of iterations are performed.

The ISI detector acts on the failed $H_1$ sub-block code word and, as appropriate, separately on the p parity bits, while the LDPC decoder utilizes the correctly decoded $H_1$ sub-block code words, the sign values and reliability information of the failed $H_1$ sub-block code word and the p parity bits to produce an $H_2$ code word for extended, block-level, LDPC decoding. Accordingly, the decoding system uses the reliability information for only the failed $H_1$ sub-block code word and the p parity bits, since the reliability information for the other $H_1$ code words is not needed for the extended decoding. The system can thus decode a large block that includes block-level LDPC code protection using buffers that are sized essentially to hold the sign values and reliability information for an $H_1$ sub-block code word.

The system achieves a substantial reduction in buffer capacity, and thus, a substantial reduction in complexity over a system that utilizes a single LDPC block code, with only a slight reduction in performance over the use of the single LDPC block code. The use of two LDPC codes in the LDPC decoder may add some complexity to the decoder, however, the increase in complexity of the LDPC decoder hardware is minimized because the two codes are of the same class, and thus, some or all of the same hardware can be used for the on-the-fly and the extended decoding. Further, the $H_1$ and $H_2$ codes may be implemented as microcode—with different microcode addresses being assigned to the sub-block and extended decoding operations, for maximum re-use of the hardware. An alternative embodiment of the system may utilize some additional hardware to accommodate the $H_1$ and $H_2$ decoding.

BRIEF DESCRIPTION OF THE DRAWINGS

The invention description below refers to the accompanying drawings, of which.

DETAILED DESCRIPTION OF AN
ILLUSTRATIVE EMBODIMENT

Figure 1:
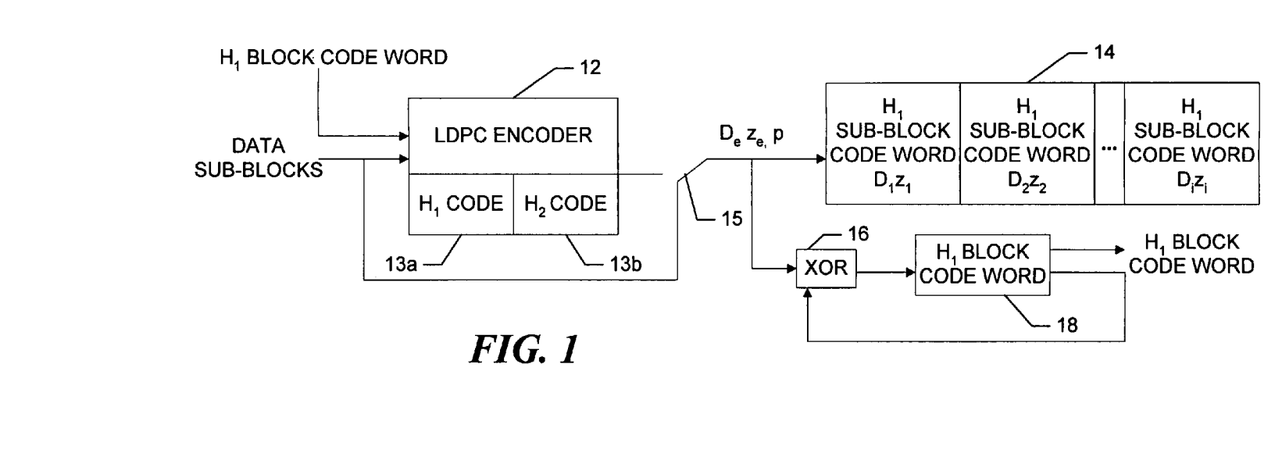
FIG. 1 is a functional block diagram of an LDPC encoding sub-system that is constructed in accordance with the invention.
Figure 2:
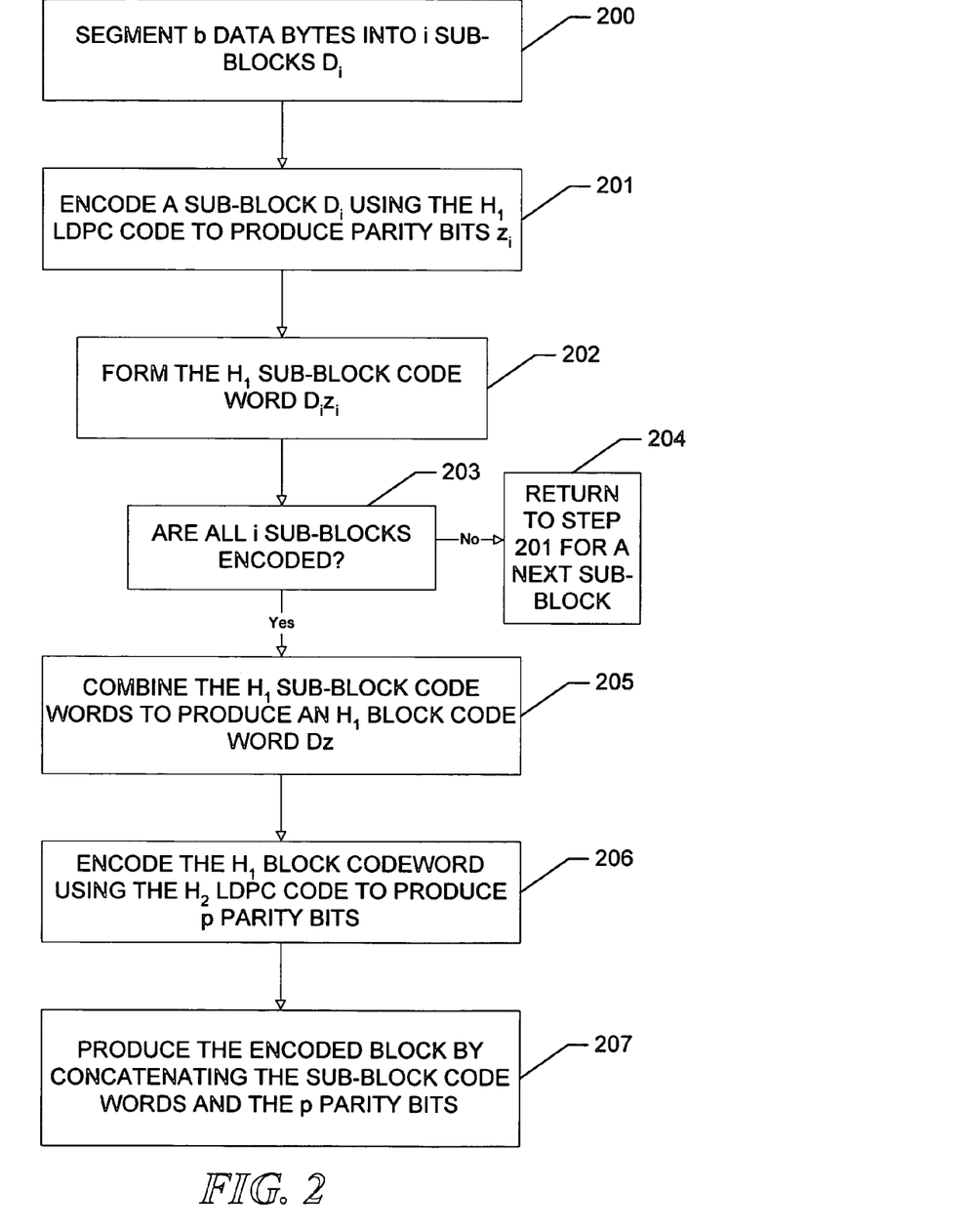
FIG. 2 is a flow chart of the operations performed by the sub-system of FIG. 1.

Referring now to FIGS. 1 and 2, a data processing system includes an LDPC encoding sub-system 10 that utilizes an LDPC encoder 12 to produce an encoded block that contains b data bytes and associated redundancy bits. The LDPC encoder 12 separately and independently encodes the b data bytes as i data sub-blocks, $D_1, D_2, \ldots D_i$ using an LDPC code $H_1$, to generate corresponding sub-block parity bits $z_1, z_2, \ldots z_i$ that together with the data produce $H_1$ sub-block code words $D_1 z_1, D_2 z_2, \ldots D_i z_i$. The encoding sub-system thus segments the data into i data sub-blocks in step 200 and in steps 202-204 separately and independently encodes the respective data sub-blocks to produce the corresponding sub-block parity bits and form $H_1$ code words $D_i z_i$. The switch 15 operates to provide the sub-block data bytes followed by the corresponding sub-block parity bits to the buffer 14.

The encoding system next combines the $H_1$ sub-block code words to produce an $H_1$ block code word Dz (step 205). The encoding system thus XOR's the $H_1$ sub-block code words using firmware or, as appropriate, one or more XOR gates (denoted in the drawing by functional block XO 14), and produces an $H_1$ block code word. The combining step may instead by iteratively performed as each of the $H_1$ sub-blocks are produced.

Figure 3:
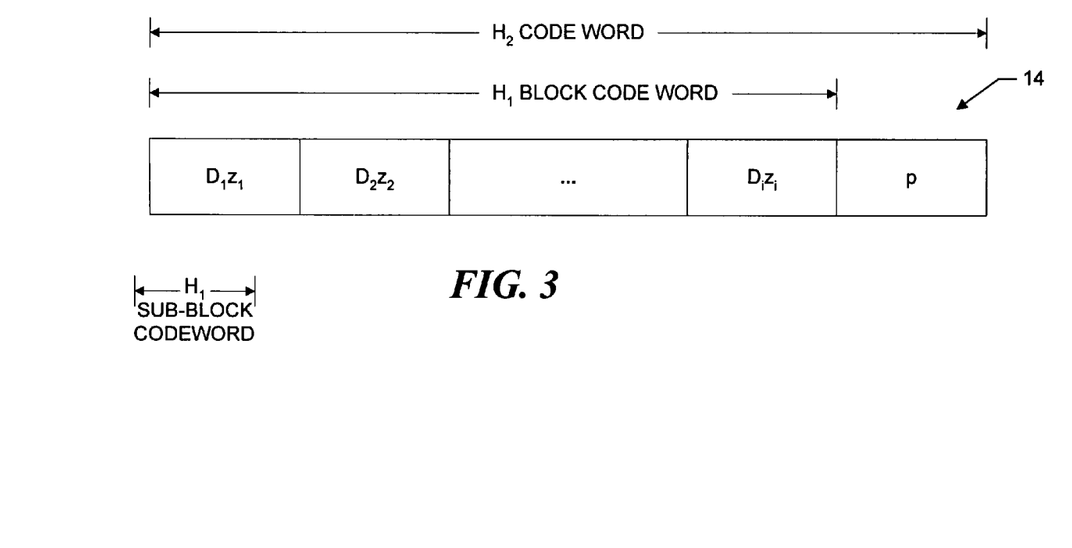
FIG. 3 illustrates an encoded block that is produced by the sub-system of FIG. 1.

The encoding sub-system next, in step 206, manipulates the $H_1$ block code word Dz in accordance with an $H_2$ LDPC code. The LDPC encoder 12 thus treats the $H_1$ block code word as "data," and manipulates the $H_1$ block code word in accordance with the $H_2$ code to produce p parity bits that correspond to the block code word. In step 207, the sub-system produces an encoded block by concatenating the $H_1$ sub-block code words $D_1 z_1, D_2 z_2, \ldots D_i z_i$ and the parity bits p, as depicted in FIG. 3.

The LDPC encoder 12 may use the same hardware for the $H_1$ and the $H_2$ encoding, with the respective codes set forth in addressable microcode $13_a$ and $13_b$. The codes are thus separately addressable for the sub-block and block code word encoding steps. Alternatively, the LDPC encoder may re-use some hardware and require some additional hardware (not shown) for the encoding using the respective LDPC codes. However, since both codes are LDPC codes, the additional hardware is significantly less than would be required if two different classes of codes, such as, an LDPC code and a Reed-Solomon code, were used.

Figure 4:
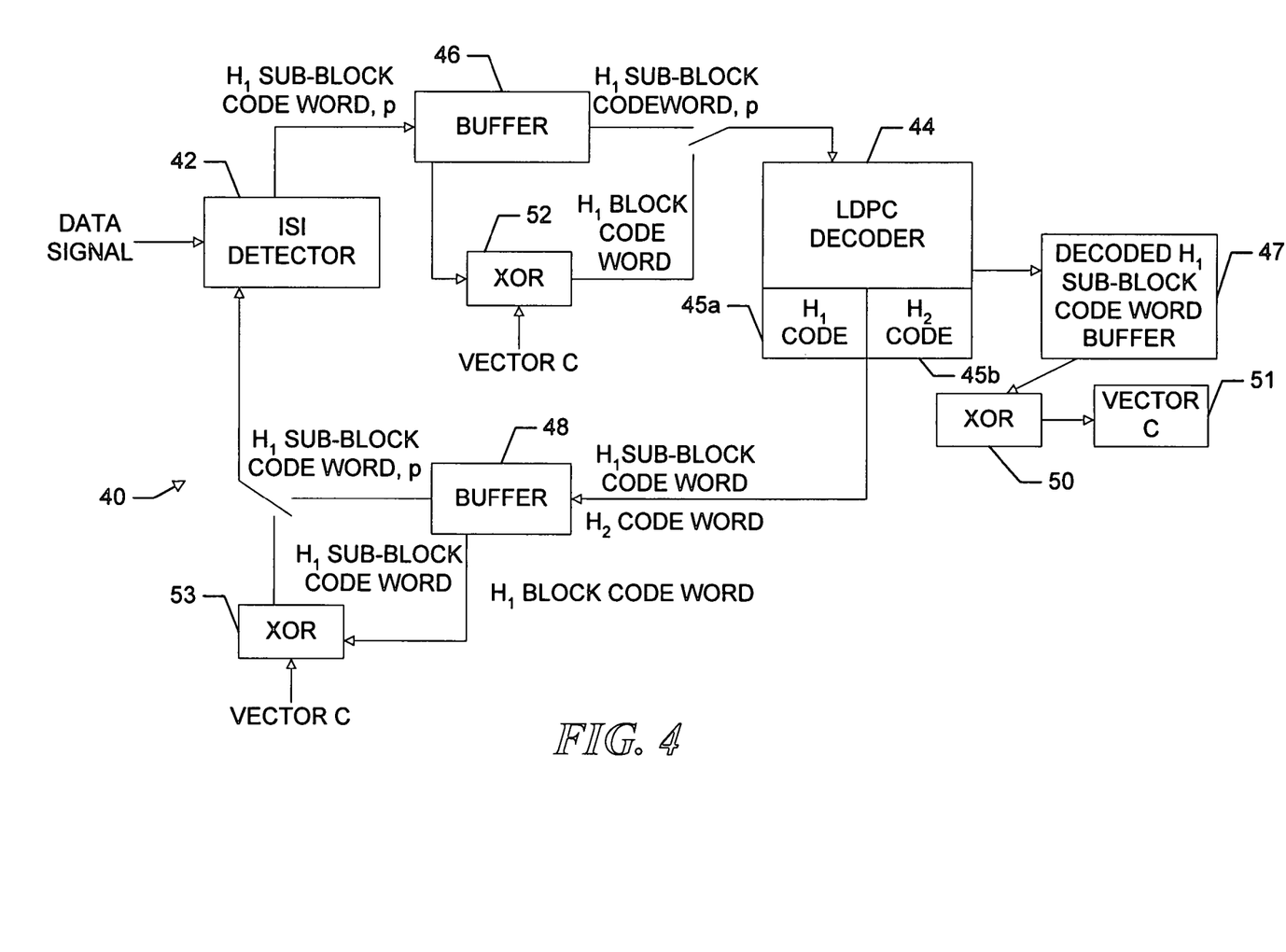
FIG. 4 is a functional block diagram of an LDPC decoding sub-system that is constructed in accordance with the invention.
Figure 5A:
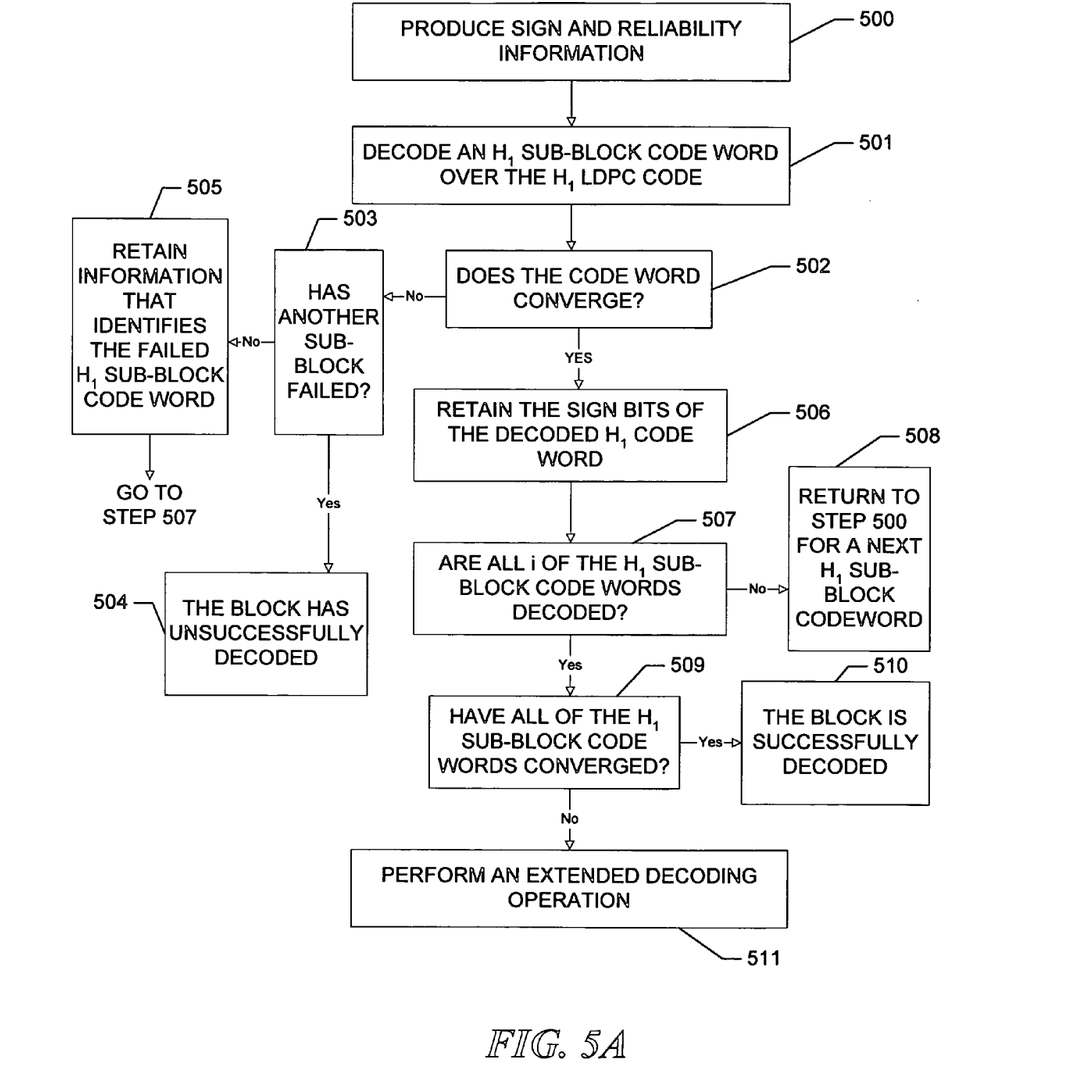
FIGS. 5A and 5B are flow charts of the operations performed by the sub-system of FIG. 4.

Referring now to FIGS. 4 and 5A, the system decodes the encoded block using an LDPC decoding sub-system 40 that includes an ISI detector 42 and an LDPC decoder 44. The decoding sub-system further includes associated buffers 46 and 48 that are essentially sized to hold the sign values and reliability information of an $H_1$ sub-block code word. As discussed in more detail below, one or more of the buffers 46 and 48 may be sized to also hold the p parity bits.

Figure 6:
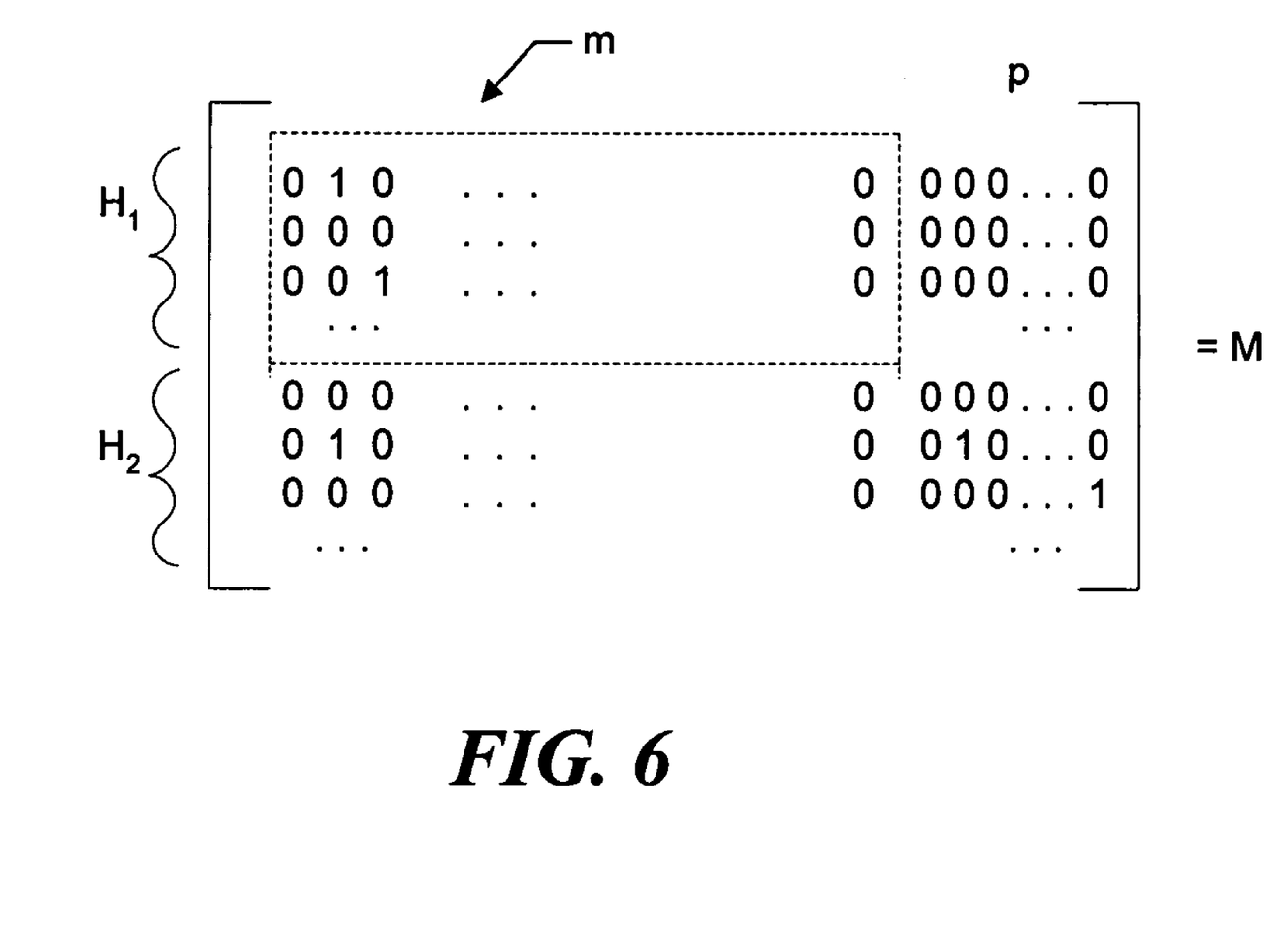
FIG. 6 matrix that is used in the encoding and decoding of code words in accordance with the invention.

The LDPC decoding system independently decodes each $H_1$ sub-block code word during on-the-fly decoding operations. The ISI detector 42 thus operates in a known manner to produce sign and reliability information for a given $H_1$ sub-block code word, for example, $D_2z_2$ (step 500). The ISI detector then supplies the information to the LDPC decoder 44 through the buffer 46. The LDPC decoder decodes the code word in accordance with a parity check matrix m that corresponds to the $H_1$ LDPC code (step 501). The matrix m is a sub-matrix of a parity check matrix M that corresponds to both the $H_1$ and $H_2$ codes. The matrix M and sub-matrix m are illustrated in FIG. 6.

The on-the-fly decoding involves manipulating a given $H_1$ sub-block code word in accordance with the sub-matrix m. The LDPC decoder 44 may use addressable microcode 45a for the $H_1$ LDPC decoding, as depicted in FIG. 4. Alternatively the LDPC decoder may use dedicated hardware (not shown). The LDPC decoding operations for each $H_1$ sub-block code word over the $H_1$ LDPC code are performed in a known manner. The decoding operations thus involve iterations within the LDPC decoder 44 and between the ISI detector 42 and the LDPC decoder 44. The LDPC decoding determines if the code word, in the example, $D_2z_2$ converges over the $H_1$ code within a predetermined number of iterations (step 502). If so, the sub-system retains the sign, or bit, values in a decoded data buffer 47 and the associated reliability information is not retained by the sub-system (step 504). If the $D_2z_2$ code word does not converge, the system does not retain any sign values or reliability information. Assuming the $D_2z_2$ sub-block code word is the only failed sub-block codeword (steps 503-505), the system later re-reads the failed sub-block, as part of an extended decoding operation, as discussed in more detail below with reference to FIG. 5B. The system thus retains only information that identifies the failed sub-block, such as a sub-block count or an offset that identifies the relative position of the sub-block in the block (step 505).

The LDPC decoder 44 and ISI detector 42 operate as described to iteratively and independently decode each of the $H_1$ sub-block code words over $H_1$ (steps 505-506). For the on-the-fly decoding, the ISI detector provides to the LDPC decoder the sign values and reliability information for a given $H_1$ sub-block code word and the LDPC decoder operates in a known manner to iteratively decode the given sub-block code word over the $H_1$ code until either the code word converges or a predetermined number of iterations have been performed. The decoding system retains the sign values for the $H_1$ sub-block code words that converge, and for a first failed sub-block code word information that identifies the sub-block. If a second $H_1$ sub-block code word fails, the system determines that the block unsuccessfully decoded and the on-the-fly decoding operation ends. Otherwise, the system continues to decode the $H_1$ sub-block code words contained in the block.

At the end of the block, the system determines if the block decoded correctly if all of the $H_1$ sub-block code words have converged (step 510). The system may then ignore the p parity bits. If a single $H_1$ sub-block code word has failed to converge, the system performs an "extended" decoding operation over the $H_2$ code (step 511), to try and correctly decode the failed sub-block code word using the p parity bits, as discussed below.

The ISI detector operating in a convention manner produces sign values and reliability information for the p parity bits after the respective $H_1$ sub-block code words have been decoded (step 512). The ISI detector may produce the sign and reliability information for the p parity bits after the sub-system determines it must perform the extended decoding operations. Alternatively, the ISI detector may produce the p parity bit sign and reliability information during the on-the-fly decoding operations and, as appropriate, ignore the p parity bits if the extended decoding is not required or use the p parity bits for the CRC check of the decoded block.

Figure 5B:
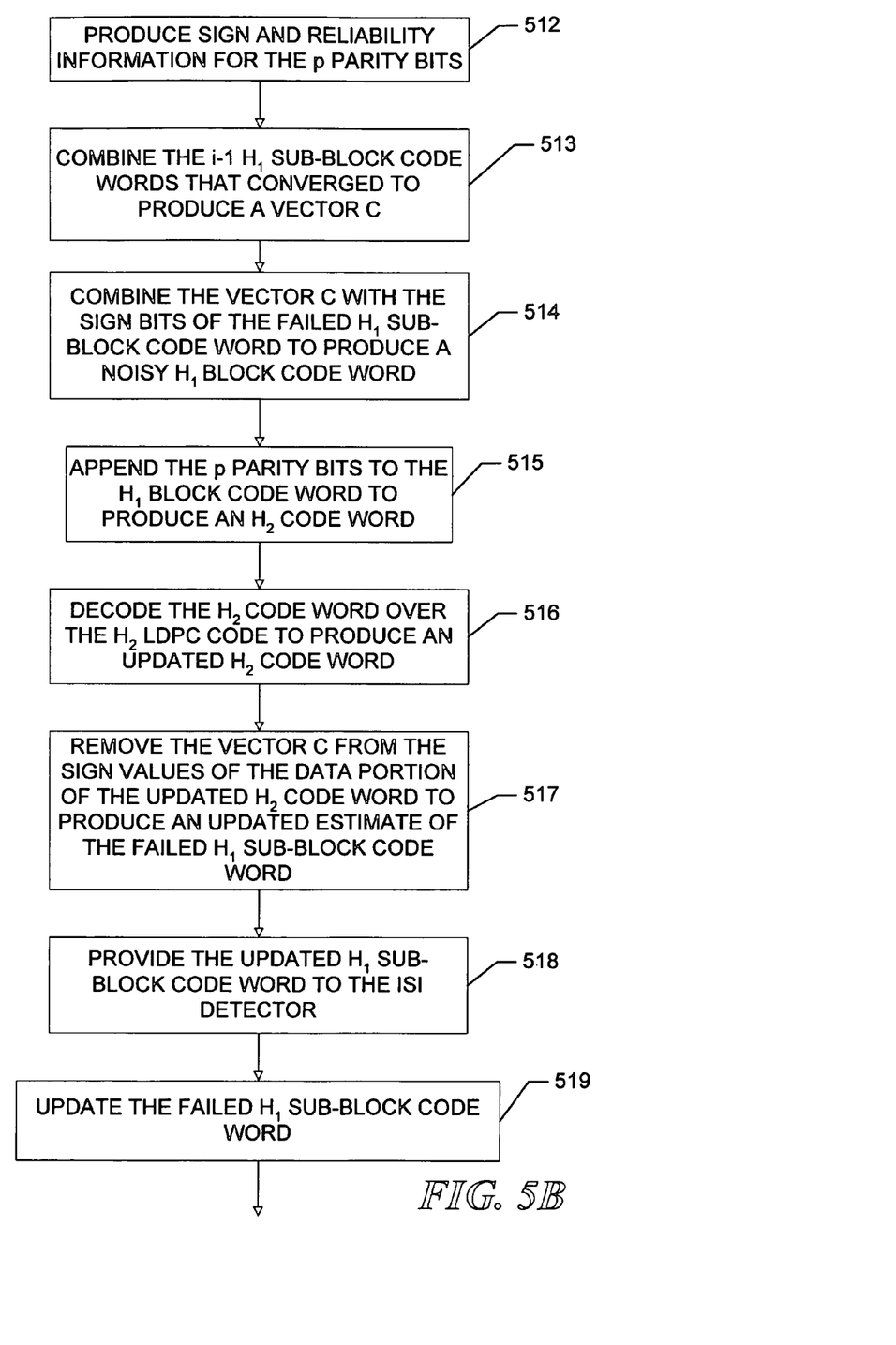

Referring now also to FIG. 5B, the extended decoding operation combines the i−1 correctly decoded $H_1$ sub-block code words that are retained in the decoded data buffer 47, to produce a vector C (step 513). The i−1 decoded $H_1$ sub-block code words, which consist of the sign values, i.e., the decoded bits, are combined, i.e., XOR'd, and the vector C is retained in the associated buffer 51. The system may use firmware or one or more XOR gates (denoted by functional block XOR 50 in the drawing) to combine the sub-block code words.

The system next combines the vector C with the sign information of the failed $H_1$ sub-block code word, to produce a "noisy" $H_1$ block code word that has associated with it the reliability information for the failed $H_1$ sub-block code word (step 514). Thus, the system re-reads the failed $H_1$ sub-block code word and the ISI detector produces corresponding sign and reliability information, which are provided to the buffer 46. The system then combines the sign bits with the vector C using firmware or one or more XOR gates (denoted in the drawing as functional block XOR 52). The reliability information of the failed $H_1$ sub-block code word applies to the $H_1$ block code word because the reliability of the combination is the lowest associated reliability of any of the sub-block code words that contributed to the combination. Thus, the associated reliability is that of the failed $H_1$ sub-block code word.

The sub-system next appends the p parity bits to the $H_1$ block code word, to produce a noisy $H_2$ code word (step 515). The $H_2$ code word sign values and reliability information are then provided to the LDPC decoder 34. The decoder manipulates the $H_2$ code word sign and reliability information in accordance with the $H_2$ code, that is, in accordance with the matrix M, in a known manner to produce updated sign values and reliability information for the $H_2$ code word (step 516). The LDPC decoder then provides the updates to the buffer 48.

The sub-system next combines the vector C with the updated sign values of the "data", or non-parity, portion of the $H_2$ code word using firmware or one or more XOR gates (denoted in the drawing as functional block XOR 53). Removing the vector C from the non-parity portion of the $H_2$ code word produces an updated version of the failed $H_1$ sub-block code word (step 517). The sub-system then provides the updated $H_1$ sub-block code word to the ISI detector for a next iteration in the extended decoding of the failed $H_1$ sub-block code word (step 518). As discussed, the ISI detector may also separately update the sign values and reliability for the p parity bits.

The ISI detector operates in a known manner to produce an iterative update to the sign values and reliability information of the failed $H_1$ sub-block code word (step 519), and provides the result to the buffer 46. As appropriate, the ISI detector also updates the sign values and associated reliability information of the p parity bits and provides the updated information to the buffer. The system may re-read one or both of the failed sub-block and the p parity bits for each iteration, or the system may instead buffer the channel waveform associated with the p parity bits, the sub-block code word, or both.

The sub-system again combines the vector C with the updated sign values of the failed $H_1$ sub-block code word to produce an updated $H_1$ block code word (step 520). The sub-system then provides to the LDPC decoder 44, as an $H_2$ code word, the sign and reliability information for the $H_1$ block code word and the p parity bits. The LDPC decoder decodes the $H_2$ code word over the $H_2$ LDPC code in a known manner using the matrix M and provides to the buffer 48 an updated $H_2$ code word, that is, updated "data" (the $H_1$ block code word) and parity bits p (step 520).

If the $H_2$ code word has not converged (step 522) and the predetermined number of iterations have not been performed (step 523), the decoding sub-system performs a next iteration (step 526). The sub-system thus removes the vector C from the sign values of the data portion of the updated $H_2$ code word, to produce updated sign values for the failed $H_1$ sub-block code word. The sub-system then provides the updated sign bits and the associated updated reliability information to the ISI detector. The ISI detector operates as discussed above and produces an iteratively updated version of the $H_1$ sub-block code word. The sub-system then combines the vector C with the sign values of the updated $H_1$ sub-block code word and decodes the result along with the p parity bits as an $H_2$ code word over the $H_2$ LDPC code.

If the $H_2$ code word converges, the sub-system removes the vector C from the "data" portion and uses the results as part of a successfully decoded block (step 524). Otherwise, the sub-system continues to iterate in the manner described by removing and adding in the vector C, until either the $H_2$ code word converges or a predetermined number of iterations have been performed (step 525). If the $H_2$ code word does not converge after the predetermined number of iterations have been performed the sub-system determines that the block has unsuccessfully decoded (step 525).

Before determining that the block has been successfully decoded, the decoding system may test what should be the now successfully decoded $H_1$ sub-block code word, by decoding the code word over the $H_1$ LDPC code.

Without the p parity bits generated by the block encoding over $H_2$, the encoded block would be unsuccessfully decoded if a single sub-block failed. Thus, the decoding sub-system utilizes the power of a block ECC without requiring buffers that are sized to hold the soft information for the entire block. Further, the sub-system achieves this advantage using two levels of LDPC codes, without requiring decoding hardware for non-LDPC codes, such as Reed Solomon ECCs. The sub-systems are thus less complex than known LDPC block encoding/decoding systems.

While the invention has been particularly shown and described with reference to preferred embodiments thereof, it will be understood by those skilled in the art that various changes in form and details can be made without departing from the spirit and scope of the invention. For example, the p parity bits may not be updated during the extended decoding operations, the vector C may be produced as the block is re-read for the extended decoding operation, and so forth. Furthermore, the terms and expressions that have been employed herein are used as terms of descriptions and not of limitation. There is no intention in the use of such terms and expressions of excluding any equivalents of the features shown and described or portions thereof. It is recognized that various modifications are possible within the scope of the invention claimed.

What is claimed is:

1. A method for encoding a block of b data bytes, the method including the steps of:

A. encoding sub-blocks of the data using a first low density parity check (LDPC) code $H_1$ to produce sub-block parity bits;

B. producing sub-block code words by appending the sub-block parity bits to the corresponding sub-blocks of data bytes;

C. combining the sub-block code words to produce an $H_1$ block code word;

D. encoding the $H_1$ block code word using a second LDPC code $H_2$ to produce block parity bits; and E. producing an encoded block by concatenating the sub-block code words and the block parity bits.

2. A method of decoding an encoded block that includes b data bytes that are encoded into i sub-block code words and p block parity bits, the method including the steps of:

A. decoding the i sub-blocks using a first LDPC code $H_1$ and retaining sign values for sub-blocks that converge;

B. determining if any sub-block fail to converge and
   if none of the sub-blocks fail to converge determining the block successfully decoded,
   if more than one fails to converge determining the block decoded unsuccessfully, and
   if only one sub-block fails to converge performing an extended decoding operation that uses the p block parity bits, the extended decoding operation including the steps of i. combining the sign values for the i−1 sub-block code words that converged to produce a vector C;

ii. combining the failed sub-block code word with the vector C to produce an $H_1$ block code word and appending the block parity bits to the $H_1$ block code word to produce a code word of a second LDPC code $H_2$ with the $H_1$ block code word as a data portion;

iii. decoding the $H_2$ code word over the $H_2$ LDPC code to produce an updated $H_2$ code word;

iv. combining the vector C with the data portion of the updated $H_2$ code word and providing the result as an updated failed sub-block code word to an ISI detector;

v. further updating the failed sub-block code word in the ISI detector;

vi. combining the vector C with the updated failed sub-block code word and appending the p parity bits to produce a further updated $H_2$ code word;

vii. decoding the further updated $H_2$ code word over the $H_2$ LDPC code to produce a further updated $H_2$ code word; and viii. repeating steps iv-vii until the $H_2$ code word either converges over the $H_2$ LDPC code or a predetermined number of iterations have been performed;

ix. if the $H_2$ code word converges removing the vector C from the data portion and including the result with the i−1 previously decoded sub-block code words as a successfully decoded block; and x. if the $H_2$ code word fails to converge determining that the block unsuccessfully decoded.

3. The method of claim 2 further including
providing the p parity bits to the ISI detector, and
updating the p parity bits and appending the updated parity bits to the updated $H_1$ block code word to produce the updated $H_2$ code word.

4. A system for decoding an encoded block that includes d data bytes that are encoded into i sub-block code words over a first LDPC code $H_1$ and p block parity bits that correspond to a second LDPC code $H_2$, the system including:

A. an ISI detector for assigning sign values and reliability information to the respective sub-block code words and separately assigning sign values to the p parity bits;

B. an LDPC decoder for decoding $H_1$ code words over the $H_1$ LDPC code and $H_2$ codewords over the $H_2$ LDPC code; and C. one or more buffers for retaining sign values for the decoded sub-block code words that converge;

D. one or more XOR gates or firmware for
  i. producing a vector C that is a combination of i-1 correctly decoded sub-block code words,
  ii. combining the vector C with a failed sub-block code word to produce an $H_1$ a block code word that is also a data portion of an $H_2$ code word, and
  iii. combining the vector C with the data portion of an updated $H_2$ code word to produce an updated failed sub-block code word,
  wherein the ISI detector and the LDPC decoder decode the sub-block code words over the $H_1$ LDPC code in an on-the-fly decoding operation and in an extended decoding operation the ISI detector decodes an updated failed sub-block code word and the LDPC decoder decodes the corresponding $H_1$ block code word and appended p parity bits as an $H_2$ code word over the $H_2$ LDPC code.

5. The system of claim 4 wherein the ISI detector further assigns reliability information to the p parity bits, and
during the extended decoding operation updates the sign values and the reliability information separately for the failed sub-block code word and the p parity bits.

6. The system of claim 4 wherein the LDPC decoder in an extended decoding operation further decodes over the $H_1$ LDPC code an updated failed sub-block code word that corresponds to the $H_2$ code word that converged over the $H_2$ LDPC code.

7. A method of decoding an encoded block that includes b data bytes that are encoded into i sub-block code words and p block parity bits, the method including the steps of:
  a. independently decoding respective sub-block code words over a first LDPC code;
  b. if all of the sub-block code words converge, determining the block successfully decoded;
  c. if more than one sub-block code word does not converge, determining that the block decoded unsuccessfully; and
  d. if a single sub-block code word fails to converge iteratively decoding the failed sub-block code word by
    i. producing an associated code word of a block-level LDPC code by combining sign values associated with the failed sub-block with a vector C that is a combination of the i-1 sub-block code words that converged, associating therewith the reliability information that corresponds to the failed sub-block code word and appending thereto sign values and reliability information for the p parity bits,
    ii. decoding the code word over the block-level LDPC code to produce an updated code word,
    iii. removing the vector C from the non-parity portion of the updated code word to produce an updated sub-block code word that corresponds to the failed sub-block code word,
    iv. decoding the updated sub-block code word to further update the associated sign and reliability information associated with the failed sub-block code word, and
    v. repeating steps i-iv using the updated sign value and reliability information until the code word converges over the block-level LDPC code or until a predetermined number of iterations have been performed, and
    vi. if the code word converges over the block-level LDPC code removing the vector C from the non-parity portion of the code word and using the result in the decoded block to produce a successfully decode block, and
    vii. if the code word does not converge over the block-level LDPC code determining that the block decoded unsuccessfully.

8. The method of claim 7 further including the steps of
updating the sign and reliability information associated with the p parity bits; and
in the step of repeating the steps i-iv including the updated sign and reliability information for the p parity bits.

9. The method of claim 8 wherein the step of decoding the updated sub-block code word includes decoding using an ISI detector.

10. The method of claim 9 wherein the step of producing an associated code word of a block-level LDPC code further includes re-reading the failed sub-block code word.

11. The method of claim 10 wherein the step of producing an associated code word of a block-level LDPC code further includes re-reading the sub-block code words that converged.

* * * * *